(12) United States Patent  
Ogihara et al.

(10) Patent No.: US 10,591,817 B2  
(45) Date of Patent: Mar. 17, 2020

(54) METHOD FOR PRODUCING COMPOSITION FOR FORMING COATING FILM FOR LITHOGRAPHY AND PATTERNING PROCESS

(71) Applicant: SHIN-ETSU CHEMICAL CO., LTD., Tokyo (JP)

(72) Inventors: Tsutomu Ogihara, Jyoetsu (JP); Motoaki Iwabuchi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 122 days.

(21) Appl. No.: 15/079,999

(22) Filed: Mar. 24, 2016

(65) Prior Publication Data

US 2016/0314991 A1    Oct. 27, 2016

(30) Foreign Application Priority Data

Apr. 24, 2015  (JP) ................................. 2015-089732

(51) Int. Cl.
*H01L 21/3213*    (2006.01)
*H01L 21/311*    (2006.01)
(Continued)

(52) U.S. Cl.
CPC .......... *G03F 7/0035* (2013.01); *G03F 7/0397* (2013.01); *G03F 7/0752* (2013.01);
(Continued)

(58) Field of Classification Search
CPC ..... G03F 7/11; G03F 7/0035; H01L 21/32139
See application file for complete search history.

(56) References Cited

U.S. PATENT DOCUMENTS 8,048,615 B2 * 11/2011 Takei .................... G03F 7/0752  
430/272.1  
2002/0197555 A1   12/2002 Rahman et al.  
(Continued)

FOREIGN PATENT DOCUMENTS

JP    2001-125277 A    5/2001  
JP    2004-523806 A    8/2004  
(Continued)

OTHER PUBLICATIONS

Dec. 21, 2016 Office Action issued in Taiwanese Patent Application No. 105112358.

(Continued)

*Primary Examiner* — Thomas T Pham  
(74) *Attorney, Agent, or Firm* — Oliff PLC

(57) ABSTRACT

The present invention provides a method for producing a composition for forming a coating film for a lithography used in manufacture of a semiconductor device by using a producing apparatus provided with a metal adsorbent and a filter, comprising the steps of: (1) introducing a solvent used in the composition into the producing apparatus, (2) circulating the solvent in the producing apparatus to adsorb a metal impurity by the metal adsorbent, (3) adding a raw material of the composition into the circulated solvent and homogenizing them to prepare the composition, and (4) circulating the prepared composition in the producing apparatus to remove a microscopic foreign matter by the filter. This method enables to produce a composition for forming a coating film for a lithography with its metal impurities, which cause an etching defect, extremely reduced.

19 Claims, 1 Drawing Sheet

(51) Int. Cl.
*G03F 7/00* (2006.01)
*G03F 7/11* (2006.01)
*G03F 7/039* (2006.01)
*G03F 7/09* (2006.01)
*G03F 7/16* (2006.01)
*G03F 7/075* (2006.01)
*H01L 21/027* (2006.01)

(52) U.S. Cl.
CPC ............... *G03F 7/094* (2013.01); *G03F 7/11* (2013.01); *G03F 7/16* (2013.01); *H01L 21/0271* (2013.01); *H01L 21/31116* (2013.01); *H01L 21/31138* (2013.01); *H01L 21/31144* (2013.01)

(56) References Cited

U.S. PATENT DOCUMENTS

| | | | |
|---|---|---|---|
| 2005/0218068 A1* | 10/2005 | Komatsu | B01J 47/12 210/500.27 |
| 2006/0234158 A1 | 10/2006 | Hatakeyama | |
| 2013/0108957 A1* | 5/2013 | Iwabuchi | G03F 7/004 430/270.1 |
| 2015/0099216 A1 | 4/2015 | Iwabuchi et al. | |
| 2015/0214068 A1* | 7/2015 | Chen | H01L 21/31144 438/703 |
| 2016/0018728 A1* | 1/2016 | Liou | G03F 1/38 430/5 |
| 2016/0086809 A1* | 3/2016 | Yang | H01L 21/32139 257/618 |
| 2016/0236124 A1* | 8/2016 | Yoshida | H01L 21/67017 |

FOREIGN PATENT DOCUMENTS

| | | |
|---|---|---|
| JP | 2006-293207 A | 10/2006 |
| JP | 2015-072418 A | 4/2015 |
| WO | 2011/125326 A1 | 10/2011 |

OTHER PUBLICATIONS

Dec. 12, 2017 Notification of Reasons for Refusal issued in Japanese Patent Application No. 2015-089732.

Jul. 10, 2018 Office Action issued in Japanese Application No. 2015-089732.

* cited by examiner

METHOD FOR PRODUCING COMPOSITION FOR FORMING COATING FILM FOR LITHOGRAPHY AND PATTERNING PROCESS

BACKGROUND OF THE INVENTION

Field of the Invention

The present invention relates to a method for producing a composition for forming a coating film for a lithography used in microfabrication in manufacture of semiconductor devices and the like, especially for producing a composition for forming a resist upper layer film, a composition for forming a silicon-containing resist under layer film, and a composition for forming an organic under layer film which are used in a multilayer resist method.

Description of the Related Art

As the LSI becomes highly integrated and achieves high-speed processing, the pattern size has been miniaturized rapidly. In relation to such miniaturization, lithography technologies accomplish fine patterning by adopting light sources with shorter wavelength and correspondingly selecting adequate compositions for forming a coating film for a lithography.

In miniaturization by using the same light source, however, if the pattern width is reduced with the thickness of the photoresist film unchanged, the aspect ratio of the developed photoresist pattern increases, resulting in a collapse of the pattern. Accordingly, the thickness of the photoresist film has been reduced in accordance with the progress of photoresist pattern miniaturization in order to keep the aspect ratio of the photoresist pattern within a proper range. As the reduction of the film thickness of the photoresist film proceeds, there arises another problem of lowering an accuracy of pattern transfer to a body to be processed.

The multilayer resist method is one of the methods to solve such a problem. In this method: an under layer film having a different etching selectivity from that of the photoresist film (resist upper layer film) intervenes between the resist upper layer film and the substrate to be processed; a pattern is formed in the resist upper layer film, and the pattern is transferred to the under layer film by dry etching, using the resist upper layer film pattern as a dry etching mask; and this pattern is further transferred to the substrate to be processed by dry etching, using the under layer film as a dry etching mask.

These compositions for forming a coating film for a lithography used in such multilayer resist methods, for example, a resist upper layer film, a silicon-containing resist under layer film, an organic under layer film usually contain metal impurities due to an environment, a device, an equipment, and raw materials. In a multilayer resist process, pattern transfers by dry etching are repeated, and accordingly such a metal impurity acts as an etching mask under certain dry etching conditions and is transferred to a substrate to be processed for a semiconductor device. This induces an electrical fault such as an open fault and a short fault in a circuit when producing a semiconductor device, and causes lowering of a production yield of a semiconductor device.

At present, purification of raw materials is considered to be most effective in order to prevent a failure caused by the metal impurity. For example, Patent Document 1 discloses a method to purify a raw material polymer by contacting with aqueous acid solution. In a composition for forming a coating film for a lithography used in the cutting edge process, however, it is impossible to totally remove an etching defect only by purification of a polymer, and it has been required to reduce the defects furthermore.

PRIOR ART DOCUMENT

Patent Document

Patent Document 1: WO 2011-125326

SUMMARY OF THE INVENTION

The present invention was made in order to solve the problem mentioned above. The object of the present invention is to provide a method for producing a composition for forming a coating film for a lithography with its metal impurities, which cause an etching defect, extremely reduced.

To solve the problem mentioned above, the present invention provides a method for producing a composition for forming a coating film for a lithography used in manufacture of a semiconductor device by using a producing apparatus provided with a metal adsorbent and a filter, comprising the steps of:

(1) introducing a solvent used in the composition for forming a coating film for a lithography into the producing apparatus, (2) circulating the solvent in the producing apparatus to adsorb a metal impurity by the metal adsorbent, (3) adding a raw material of the composition for forming a coating film for a lithography into the circulated solvent and homogenizing them to prepare the composition for forming a coating film for a lithography, and (4) circulating the prepared composition for forming a coating film for a lithography in the producing apparatus to remove a microscopic foreign matter by the filter.

Such a method enables to produce a composition for forming a coating film for a lithography with its metal impurities, which cause an etching defect, extremely reduced.

As the metal adsorbent, it is preferred to use a porous material or a membrane in which sulfo group and/or carboxyl group is/are bound to a surface of a carrier.

It is preferable for the carrier to contain any of cellulose, diatomaceous earth, polystyrene, polyethylene, and glass.

Such a metal adsorbent can adsorb and remove metal impurities without contaminating the solvent, and can be suitably used in the method for producing a composition for forming a coating film for a lithography of the present invention.

It is preferable for the filter to have a filtering material containing any of fluorocarbon, cellulose, nylon, polyester, and hydrocarbon.

The foregoing filtering material can be suitably used in the present invention.

It is also preferred for the filter to have a filtering material with a pore size of 20 nm or less.

Using such a filtering material, it is possible to remove microscopic foreign matters in the composition for forming a coating film for a lithography more effectively.

In the step (2), it is preferable to circulate the solvent until each content of iron, calcium, and sodium in the solvent are 50 ppt or less.

It is possible to reduce metal impurities, which cause an etching defect, definitely by setting the contents of iron, calcium, and sodium in the solvent as the indicator of cleanliness and circulating the solvent until each content are a prescribed amount or less.

It is preferable to perform the step (4) without exchanging the filtering material provided in the filter after the step (2).

This enables to perform a circulative filtration of the prepared composition for forming a coating film for a lithography using a filter in which metal impurities are sufficiently removed.

It is also possible to circulate the prepared composition for forming a coating film for a lithography without passing through the metal adsorbent in the step (4).

This enables to remove a microscopic foreign matter in the composition for forming a coating film for a lithography without adsorbing an effective component contained in the composition for forming a coating film for a lithography by the metal adsorbent.

The composition for forming a coating film for a lithography can be any of a composition for forming an organic under layer film, a composition for forming a silicon-containing resist under layer film, and a composition for forming a resist upper layer film selected from a composition for forming a photosensitive resist film which is photosensitive to EUV light or light having a wavelength of 200 nm or less, an electron beam sensitive resist composition, a directed self-assembly resist composition, and a composition for forming a resist upper layer film for a nanoimprint.

The present invention is particularly suitable for producing the foregoing composition for forming a coating film for a lithography since such a composition for forming a coating film for a lithography is required to minimize metal impurities, which cause an etching defect.

It is preferable for the composition for forming an organic under layer film to contain a repeating unit derived from an aromatic compound.

It is also preferable for the aromatic compound to comprise a phenol derivative, a naphthalene derivative, a naphthol derivative, a fluorene derivative, a phenanthrene derivative, an anthracene derivative, a pyrene derivative, a chrysene derivative, or a naphthacene derivative.

It is also preferable for the aromatic compound to comprise a compound obtained by reacting an aldehyde derivative with either or both of a phenol derivative and a naphthol derivative.

The foregoing compositions for forming an organic under layer film, for example, are suitable as a composition for forming a coating film for a lithography produced by the inventive production method.

It is preferable for the composition for forming a silicon-containing resist under layer film to contain a polysiloxane.

It is preferable for the composition for forming a silicon-containing resist under layer film to have a silicon content of 10% by mass or more relative to the total amount of the composition.

The foregoing compositions for forming a silicon-containing resist under layer film, for example, are suitable as a composition for forming a coating film for a lithography produced by the inventive production method.

The present invention also provides a patterning process comprising the steps of: forming an organic under layer film on a body to be processed by using a composition for forming an organic under layer film, forming a silicon-containing resist under layer film on the organic under layer film by using a composition for forming a silicon-containing resist under layer film, forming a resist pattern on the silicon-containing resist under layer film by using a composition for forming a resist upper layer film, transferring the pattern to the silicon-containing resist under layer film by dry etching using the resist pattern as an etching mask, transferring the pattern to the organic under layer film by dry etching using the silicon-containing resist under layer film having the transferred pattern as an etching mask, and transferring the pattern to the body to be processed by dry etching using the organic under layer film having the transferred pattern as an etching mask, wherein one or more of the composition for forming an organic under layer film, the composition for forming a silicon-containing resist under layer film, and the composition for forming a resist upper layer film is/are produced by any of the foregoing methods.

Patterning by using the composition for forming a coating film for a lithography produced by the inventive method enables to extremely reduce etching defects, and thereby enables to improve the production yield of a semiconductor device especially on which a fine pattern is formed.

It is preferable to use a semiconductor device substrate or the semiconductor device substrate coated with any of a metal film, a metal carbide film, a metal oxide film, a metal nitride film, a metal oxycarbide film, and a metal oxynitride film as the body to be processed.

It is preferable for the metal consisting of the body to be processed to contain silicon, titanium, tungsten, hafnium, zirconium, chromium, germanium, copper, aluminum, indium, gallium, arsenic, palladium, iron, tantalum, iridium, molybdenum, or an alloy thereof.

The foregoing bodies to be processed, for example, can be suitably used in the inventive patterning process.

As described above, the inventive method for producing a composition for forming a coating film for a lithography enables to produce a composition for forming a coating film for a lithography with its metal impurities, which cause an etching defect, extremely reduced. By using the composition for forming a coating film for a lithography produced by such a method, it is possible to extremely reduce etching defects generated during pattern transfer by a dry etching process in a multilayer resist method. Accordingly, the composition for forming a coating film for a lithography produced by the inventive method is suitable for a patterning process by a multilayer resist method especially performing an immersion exposure, double patterning, an organic solvent development, and so on, and finally, it is possible to improve the production yield of a semiconductor device by using the composition for forming a coating film for a lithography produced by the inventive method in such a patterning process.

DETAILED DESCRIPTION OF THE PREFERRED EMBODIMENTS

Figure 1:
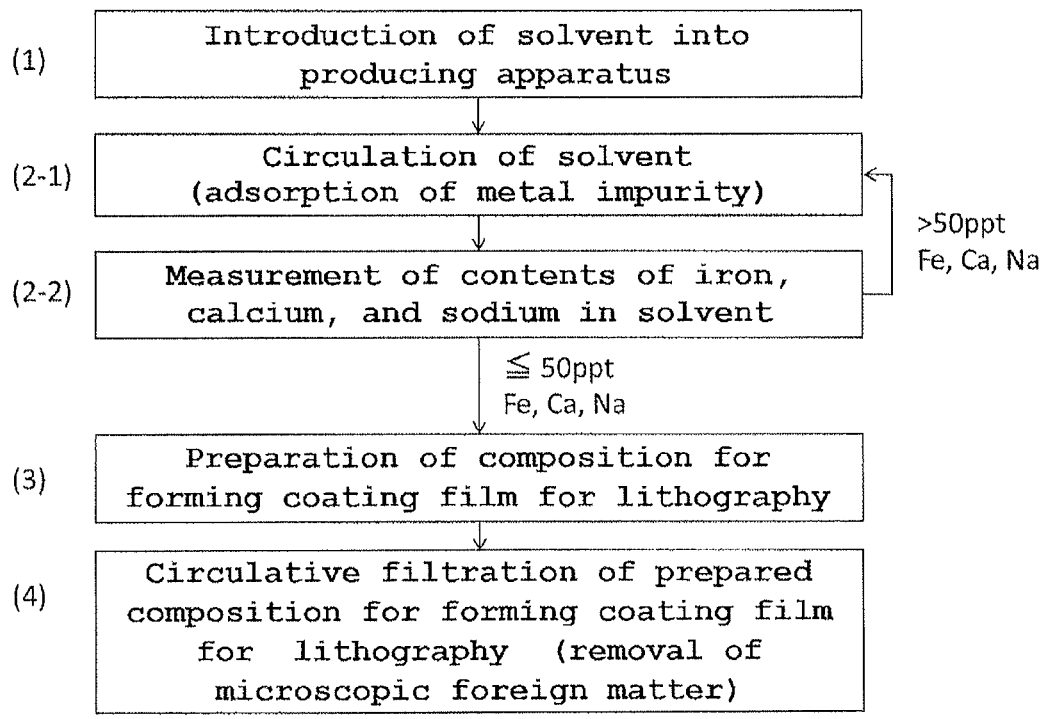
FIG. 1 is a flow chart to show an example of a method for producing a composition for forming a coating film for a lithography of the present invention.

In relation to recent miniaturization of a circuit pattern of semiconductor devices, miniaturization of a resist upper layer film pattern is also proceeding, and a coating film for a lithography is required to reduce the etching defects compared to previous films as in every coating film for a lithography used in a multilayer resist process. Especially, it is required to minimize etching defects due to metal impurities in an organic under layer film which directly contacts to a circuit part of a substrate for manufacturing a semiconductor device, a resist upper layer film and a silicon-containing resist under layer film which are used as a mask to transfer a formed pattern to lower films.

The present inventors have diligently investigated the origins of metal impurities, which cause an etching defect, contained in a coating film for a lithography and have found that not only metal impurities from raw materials of a composition for forming a coating film for a lithography, but also metal impurities from the environment or a device can be a cause of the etching defects, in many cases.

Accordingly, the present inventors have continued examination to reduce such defects to found that it is possible to produce a composition for forming a coating film for a lithography with its metal impurities, which cause an etching defect, extremely reduced by introducing a solvent used in the composition for forming a coating film for a lithography into a producing apparatus provided with a metal adsorbent which can adsorb metal impurities, and circulating the solvent to remove metal impurities in the solvent and in the producing apparatus prior to producing the composition for forming a coating film for a lithography, and then adding a raw material of the composition for forming a coating film for a lithography into the solvent and filtering it; and thereby have accomplished the present invention.

The present invention is a method for producing a composition for forming a coating film for a lithography used in manufacture of a semiconductor device by using a producing apparatus provided with a metal adsorbent and a filter, comprising the steps of:

(1) introducing a solvent used in the composition for forming a coating film for a lithography into the producing apparatus,
(2) circulating the solvent in the producing apparatus to adsorb a metal impurity by the metal adsorbent,
(3) adding a raw material of the composition for forming a coating film for a lithography into the circulated solvent and homogenizing them to prepare the composition for forming a coating film for a lithography, and
(4) circulating the prepared composition for forming a coating film for a lithography in the producing apparatus to remove a microscopic foreign matter by the filter.

Hereinafter, the present invention are specifically described with referring the figures, however, the present invention is not limited thereto.

<Method for Producing Composition for Forming Coating Film for Lithography>

First, FIG. 1 shows an example of a step flow of a method for producing a composition for forming a coating film for a lithography of the present invention. In a method shown in a flow chart of FIG. 1, at first, the solvent used in a composition for forming a coating film for a lithography is introduced to the producing apparatus ((1) in FIG. 1). Then, the solvent is circulated in the producing apparatus and the metal impurity is adsorbed by the metal adsorbent ((2-1) in FIG. 1). Then, a part of the circulated solvent is sampled and the contents of metal impurities in the solvent are measured to check the cleanliness ((2-2) in FIG. 1). If a desired cleanliness has not be obtained as a result of the check, solvent circulation is repeated. If metal impurities are removed to a desired cleanliness, a raw material of the composition for forming a coating film for a lithography is added into the circulated solvent and homogenizing them to prepare the composition for forming a coating film for a lithography ((3) in FIG. 1). Then, the prepared composition for forming a coating film for a lithography is circulated in the producing apparatus to remove a microscopic foreign matter by the filter ((4) in FIG. 1).

[Producing Apparatus]

Figure 2:
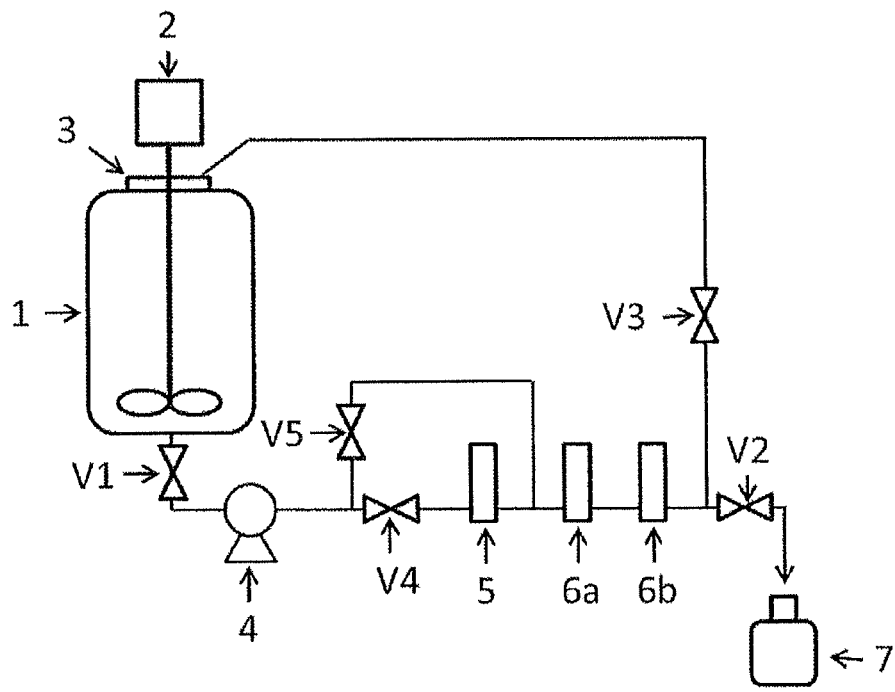
FIG. 2 is a schematic diagram of an example of a producing device of a composition for forming a coating film for a lithography used in the present invention.

FIG. 2 shows an example of a producing apparatus used in the method for producing a composition for forming a coating film for a lithography of the present invention. The producing apparatus of FIG. 2 is composed of a preparation tank 1 to store a solvent or a composition for forming a coating film for a lithography, a stirrer 2 and a supply port 3 which are provided in the preparation tank 1, a liquid-supply pump 4 to circulate the solvent or the composition for forming a coating film for a lithography, a metal adsorbent 5 to adsorb a metal impurity, filters 6a and 6b to remove a microscopic foreign matter, a product container 7 to collect the produced composition for forming a coating film for a lithography, tubes to connect these, and so on. The producing apparatus is further provided with a tank valve V1 to intercept the supplies of the solvent or the composition for forming a coating film for a lithography from the preparation tank 1, a collection valve V2 to be opened when pouring the produced composition for forming a coating film for a lithography into the product container 7, a circulation valve V3 to be opened when circulating the solvent or the composition for forming a coating film for a lithography, a metal adsorbent valve V4 to be opened when passing the solvent or the composition for forming a coating film for a lithography thorough the metal adsorbent, a metal-adsorbent bypass valve V5 to separate the metal adsorbent from the circulating passage.

(Metal Adsorbent)

It is preferable to use a porous material or a membrane in which sulfo group and/or carboxyl group is/are bound to a surface of a carrier as the metal adsorbent. It is preferable for the carrier to contain any of cellulose, diatomaceous earth, polystyrene, polyethylene, and glass. Such a metal adsorbent can adsorb and remove metal impurities without contaminating the organic solvent.

(Filter)

The filter is provided with a filtering material to remove a microscopic foreign matter. It is preferable to attach the filtering material prior to circulating the solvent since the metal impurity adhered to the inside of the producing apparatus by attaching the filtering material can be adsorbed when the solvent is circulated.

It is possible to select a pore size of the filtering material to remove a microscopic foreign matter properly according to a cleanliness required to the product (the composition for forming a coating film for a lithography). For example, it is preferable to use a filtering material with a pore size of 20 nm or less if reduction of coating defects is required, and it is preferable to use a filtering material with a pore size of 10 nm or less if higher cleanliness is required.

As a material of the filtering material, fluorocarbons, celluloses, nylons, polyesters, hydrocarbons, and so on may be mentioned. Among them, the filtering material made from nylon, hydrocarbons such as polyethylene and polypropylene, and a polyfluorocarbon called Teflon (registered trade name) are preferable in a filtration step of a composition for forming a coating film for a lithography.

It is to be noted that when plural of filters are attached like in FIG. 2, the filtering materials provided in the filter 6a and filter 6b may be composed of different materials with each other.

In the following, each step of a method for producing a composition for forming a coating film for a lithography will be described in more detail.

[(1) Introduction of Solvent into Producing Apparatus]

First, only a solvent used in a composition for forming a coating film for a lithography to be produced by the present invention introduced into the producing apparatus.

Solvents used in this step may be any conventional solvent used for a composition for forming a coating film for a lithography, and is not particularly limited. Illustrative examples thereof include, alcohols such as methoxyethanol, butoxyethanol, methoxypropanol, ethoxypropanol, propoxypropanol, and diacetone alcohol; ketones such as 2-heptanone and cyclohexanone; ethers such as ethylene glycol dimethyl ether, diethylene glycol dimethyl ether, and propylene glycol ethyl ether; esters such as butyl acetate, ethyl lactate, ethyl cellosolve acetate, propylene glycol methylether acetate, and γ-butyrolactone.

[(2) Circulation of Solvent (Adsorption of Metal impurity)]

Then, the solvent introduced into the producing apparatus is circulated in the producing apparatus. In this step, metal impurities in the preparation tank 1 and each tube are transferred to the solvent, and the transferred metal impurities are adsorbed by the metal adsorbent 5. It is preferred to attach filtering materials which are used for the production to the filters 6a and 6b in this step in order to enhance the cleanliness of the filtering materials provided in the filters. The circulation time of the solvent may be appropriately set according to an amount of the solvent or a desired cleanliness.

In this step, the cleanliness of the solvent may be checked by sampling the solvent circulated in the producing apparatus to measure the content of metal impurities contained in the solvent. As the sampling method of the circulated solvent from the producing apparatus shown in FIG. 2, solvent drawing by opening collection valve V2 and solvent sampling via the supply port 3 of the preparation tank 1 may be mentioned.

It is preferable to use any of inductively coupled plasma mass spectrometer (ICP-MS), inductively coupled plasma atomic emission spectrometer (ICP-AES), and atomic absorption spectrometer (AAS) as a detector for measuring a content of the metal impurities. These ICP-MS, ICP-AES, and AAS are especially suitable to check the cleanliness of the circulated solvent in the present invention since these detectors can measure accurate values in an accuracy up to 0.01 ppb (10 ppt).

In the solvent circulated in a production apparatus, lower contents of metal impurities indicate a higher cleanliness. Actually, however, it is extremely difficult to make the contents to be zero. Accordingly, it is preferred to circulate the solvent until the contents are 100 ppt or less in practice. Since iron, calcium, and sodium can be an indicator of the contamination, they can be used as an indicator of cleanliness in a producing apparatus. More specifically, it is preferable to make each content of iron, calcium, and sodium to be 50 ppt or less. In such contents, it is possible to produce a composition for forming a coating film for a lithography with its metal impurities, which cause an etching defect, reduced compared to prior methods.

When each content of metal impurities (iron, calcium, and sodium) thus measured are larger than 50 ppt (>50 ppt), it is preferable to circulate the solvent again in the producing apparatus until each content of metal impurities in the solvent are 50 ppt or less. By circulating the solvent until each content of metal impurities are 50 ppt or less (≤50 ppt) before proceeding to the next step (3), the metal impurities contained in the producing apparatus and the solvent can be reduced prior to introducing raw materials, thereby it is possible to extremely reduce etching defects due to metal impurities.

[(3) Preparation of Composition for Forming Coating Film for Lithography]

Then, the composition for forming a coating film for a lithography is prepared in the producing apparatus. To the solvent circulated in the producing apparatus as described above, the raw materials of the composition for forming a coating film for a lithography is added via the supply port 3 of the preparation tank 1 and stirred by the stirrer 2 to homogenize, thereby preparing the composition.

[(4) Circulative Filtration of Prepared Composition for Forming Coating Film for Lithography (Removal of Microscopic Foreign Matter)]

Then, circulative filtration is performed on the prepared composition for forming a coating film for a lithography. It is possible to remove metal impurities by the metal adsorbent and to remove microscopic foreign matters by the filter by passing the prepared composition for forming a coating film for a lithography through the metal adsorbent 5 and the filters 6a and 6b provided with filtering materials.

Prior to the production, a filtering material of the filter is usually exchanged, and this operation is generally performed on manual. Accordingly, worker-originated metal impurity adheres to the filtering material, thereby adhere to a product. In order to avoid such contamination, some means such as automation by a robot and so on can be mentioned but they are not economical. Accordingly, it is preferred to circulate the solvent with the filtering material being attached in the foregoing step (2) to remove a metal impurity adhered on the filtering material simultaneously, and to perform the steps (3) and (4) after the step (2) without exchanging the filtering material.

In some case, a composition for forming a coating film for a lithography contains an effective component which is adsorbed by a metal adsorbent. In this case, it is preferred to reduce the content of metal impurities in the producing apparatus sufficiently by circulating the solvent previously, then introduce sufficiently clean raw materials in the process (3), and then circulate the composition for forming a coating film for a lithography without passing through the metal adsorbent. Such a method enables to produce a composition for forming a coating film for a lithography, in which the metal impurities are sufficiently reduced, on the other hand the effective component contained in the composition for forming a coating film for a lithography is not adsorbed.

In producing by such a method, the circulation may be performed, for example, with the metal adsorbent valve V4 closed and the metal-adsorbent bypass valve V5 opened in FIG. 2 before circulating the composition for forming a coating film for a lithography prepared in the step (3). This enables to remove microscopic foreign matters by passing the prepared composition for forming a coating film for a lithography through filters 6a and 6b provided with filtering materials without passing through the metal adsorbent 5.

Subsequently, the collection valve 2 is opened to collect the prepared and filtrated composition for forming a coating film for a lithography into the product container 7, thereby finishing a production process of the composition for forming a coating film for a lithography. The prepared composition for forming a coating film for a lithography may be checked its cleanliness before pouring it into the product container 7, if required.

The production method of the present invention is applicable to any production of a composition for forming a coating film for a lithography. It is particularly suitable for producing a composition for forming a resist upper layer film such as a photosensitive resist composition which is photosensitive to EUV light or light having a wavelength of 200 nm or less, an electron beam sensitive resist composition, a directed self-assembly resist composition, a composition for forming a resist upper layer film for a nanoimprint, a composition for forming a silicon-containing resist under layer film, a composition for forming an organic under layer film, etc.

It is preferable for the composition for forming an organic under layer film to contain a repeating unit derived from an aromatic compound. Illustrative examples of the preferable aromatic compound include a phenol derivative, a naphthalene derivative, a naphthol derivative, a fluorene derivative, a phenanthrene derivative, an anthracene derivative, a pyrene derivative, a chrysene derivative, or a naphthacene derivative, especially a compound obtained by reacting an aldehyde derivative with either or both of a phenol derivative and a naphthol derivative.

It is preferable for the composition for forming a silicon-containing resist under layer film to contain a polysiloxane, especially to have a silicon content of 10% by mass or more relative to the total amount of the composition.

<Patterning Process>

The present invention also provides a patterning process comprising the steps of: forming an organic under layer film on a body to be processed by using a composition for forming an organic under layer film, forming a silicon-containing resist under layer film on the organic under layer film by using a composition for forming a silicon-containing resist under layer film, forming a resist pattern on the silicon-containing resist under layer film by using a composition for forming a resist upper layer film, transferring the pattern to the silicon-containing resist under layer film by dry etching using the resist pattern as an etching mask, transferring the pattern to the organic under layer film by dry etching using the silicon-containing resist under layer film having the transferred pattern as an etching mask, and transferring the pattern to the body to be processed by dry etching using the organic under layer film having the transferred pattern as an etching mask, wherein one or more of the composition for forming an organic under layer film, the composition for forming a silicon-containing resist under layer film, and the composition for forming a resist upper layer film is/are produced by any of the foregoing methods of the present invention.

[Body to be Processed]

The body to be processed is preferably a semiconductor device substrate or the semiconductor device substrate coated with any of a metal film, a metal carbide film, a metal oxide film, a metal nitride film, a metal oxycarbide film, and a metal oxynitride film. Furthermore, the metal consisting of the body to be processed preferably contains silicon, titanium, tungsten, hafnium, zirconium, chromium, germanium, copper, aluminum, indium, gallium, arsenic, palladium, iron, tantalum, iridium, molybdenum, or an alloy thereof.

[Organic Under Layer Film]

In the patterning process of the present invention, it is preferable to form the organic under layer film by using a composition for forming an organic under layer film produced by the above-mentioned method for producing a composition for forming a coating film for a lithography of the present invention. The coating method may be any conventional method.

[Silicon-Containing Resist Under Layer Film]

In the patterning process of the present invention, it is preferable to form the silicon-containing resist under layer film by using the above-mentioned composition for forming a silicon-containing resist under layer film produced by a method for producing a composition for forming a coating film for a lithography of the present invention. The coating method may be any conventional method.

[Resist Pattern]

In the patterning process of the present invention, it is preferable to form the resist pattern by using a composition for forming a resist upper layer film produced by the above-mentioned method for producing a composition for forming a coating film for a lithography of the present invention. The coating method may be appropriately selected according to the composition for forming a resist upper layer film to be used.

[Etching]

In the patterning process of the present invention, the etching may be performed by the conventional method.

The above-mentioned method for producing a composition for forming a coating film for a lithography of the present invention enables to reduce the content of the metal impurities in a producing apparatus securely by removing the metal impurities until the content thereof in the circulating solvent is in a prescribed amount or less, and therefore enables to produce a composition for forming a coating film for a lithography with its metal impurities, which cause an etching defect, reduced. The composition for forming a coating film for a lithography thus produced can reduce etching defects, and therefore is applicable to a patterning process by a multilayer resist method performing an immersion exposure, double patterning, organic solvent development, and so on, and furthermore enables to improve a production yield of a semiconductor device.

EXAMPLE

Hereinafter, the present invention will be explained in more detail by showing Example and Comparative Example, but the present invention is not limited thereto.

<Producing Composition for Forming Coating Film for Lithography>

Example 1-1

(1) Introduction of Solvent to Producing Apparatus

The producing apparatus shown in FIG. 2 was used, and Zeta Plus (trade mark) adsorptive depth filter (40QSH) (manufactured by 3M Japan Limited) as the metal adsorbent 5, a filter cartridge with a pore size of 20 nm made from nylon as the filter 6a, and a filter cartridge with a pore size of 5 nm made from polyethylene as the filter 6b were attached to the producing apparatus. Then, 34 kg of propylene glycol methyl ether acetate (in the following: PGMEA) was introduced as the solvent via the supply port 3 of the preparation tank 1 with a capacity of 100 L and stirred by the stirrer 2 for 1 hour.

(2-1) Circulation of Solvent (Adsorption of Metal Impurity)

Then, the stirrer 2 was stopped, followed by opening the tank valve V1, the circulation valve V3, and the metal adsorbent valve V4, closing the collection valve V2 and the metal-adsorbent bypass valve V5, and subsequently starting the liquid-supply pump 3 to circulate PGMEA for 24 hours.

(2-2) Measurement of Contents of Iron, Calcium, and Sodium in Solvent

A small amount of the foregoing circulated PGMEA was sampled to a clean container made from fluororesin by opening the collection valve V2. This PGMEA was subjected to metal elemental analysis using 7700s (manufactured by Agilent Technologies Japan, Ltd.) to reveal that sodium: 5 ppt, calcium: 7 ppt, and iron: 7 ppt.

(3) Preparation of Composition for Forming Coating Film for Lithography

Then, 28 kg of 18% by mass PGMEA solution of the condensate of bisphenolfluorene-formaldehyde shown below, 500 g of NIKALAC MX-270 (manufactured by SANWA CHEMICAL CO., LTD), and 200 g of the acid generator AG shown below were added into the producing apparatus and stirred for 1 hour to prepare a composition for forming an organic under layer film.

(4) Circulative Filtration of Prepared Composition for Forming Organic Under Layer Film (Removal of Microscopic Foreign Matter)

The stirrer 2 was stopped, and then the tank valve V1, the circulation valve V3, and the metal adsorbent valve V4 were opened, the collection valve V2 and the metal-adsorbent bypass valve V5 were closed, followed by starting the liquid-supply pump 3 to circulate the prepared composition for forming an organic under layer film at a flow rate of 10 kg/h for 144 hours, with passing through the metal adsorbent 5. Thus obtained composition for forming an organic under layer film UL1 was collected in a clean resin container by opening the collection valve V2. The obtained composition for forming an organic under layer film UL1 was subjected to metal elemental analysis to reveal that sodium: 5 ppt, calcium: 8 ppt, and iron: 5 ppt.

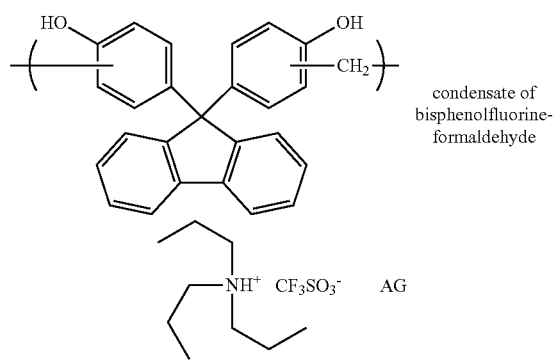

condensate of bisphenolfluorine-formaldehyde

AG

Example 1-2

From the step (1) to the step (2-2) were performed as in Example 1-1 to circulate 52 kg of PGMEA for 24 hours. The obtained PGMEA was subjected to metal elemental analysis to reveal that sodium: 6 ppt, calcium: 6 ppt, and iron: 8 ppt.

Then, 22 kg of 20% by mass PGMEA solution of the condensate of dihydroxynaphthalene-formaldehyde shown below, 450 g of NIKALAC MX-270 (manufactured by SANWA CHEMICAL CO., LTD), and 72 g of acid generator AG were added into the producing apparatus and stirred for 1 hour in a similar manner as in the step (3) of Example 1-1 to prepare a composition for forming an organic under layer film.

The stirrer 2 was stopped, and then, as the step (4), the tank valve V1, the circulation valve V3, and the metal-adsorbent bypass valve V5 were opened, the collection valve V2 and the metal adsorbent valve V4 were closed, followed by starting the liquid-supply pump 3 to circulate the prepared composition for forming an organic under layer film at a flow rate of 10 kg/h for 144 hours, without passing through the metal adsorbent 5. Thus obtained composition for forming an organic under layer film UL2 was collected in a clean resin container by opening the collection valve V2. The obtained composition for forming an organic under layer film UL2 was subjected to metal elemental analysis to reveal that sodium: 15 ppt, calcium: 28 ppt, and iron: 35 ppt.

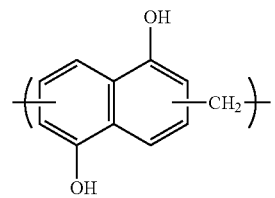

Example 1-3

From the step (1) to the step (2-2) were performed as in Example 1-1 to circulate 64 kg of propylene glycol monoethyl ether (in the following: PGEE) for 24 hours. The obtained PGEE was subjected to metal elemental analysis to reveal that sodium: 10 ppt, calcium: 12 ppt, and iron: 16 ppt.

Then, as the step (3), 16 kg of 10% by mass PGEE solution of the polysiloxane compound shown below and 8 kg of deionized water were added into the producing apparatus and stirred for 1 hour to prepare a composition for forming a silicon-containing resist under layer film.

The stirrer 2 was stopped, and then the prepared composition for forming a silicon-containing resist under layer film was circulated without passing through the metal adsorbent 5 in a similar manner as in the step (4) of Example 1-2. Thus obtained composition for forming a silicon-containing resist under layer film MIA was collected in a clean resin container by opening the collection valve V2. The obtained composition for forming a silicon-containing resist under layer film ML1 was subjected to metal elemental analysis to reveal that sodium: 22 ppt, calcium: 30 ppt, and iron: 28 ppt.

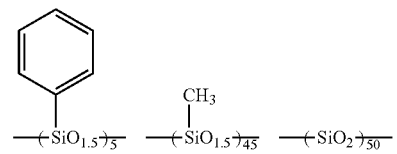

Example 1-4

From the step (1) to the step (2-2) were performed as in Example 1-1 to circulate 60 kg of PGMEA for 24 hours. The obtained PGMEA was subjected to metal elemental analysis to reveal that sodium: 8 ppt, calcium: 5 ppt, and iron: 10 ppt.

Then, as the step (3), 16 kg of 20% by mass PGMEA solution of the polysiloxane compound shown below and 20 g of acid generator AG were added into the producing apparatus and stirred for 1 hour to prepare a composition for forming a silicon-containing resist under layer film.

The stirrer 2 was stopped, and then the prepared composition for forming a silicon-containing resist under layer film was circulated with passing through the metal adsorbent 5 in a similar manner as in the step (4) of Example 1-1. Thus obtained composition for forming a silicon-containing resist under layer film ML2 was collected in a clean resin container by opening the collection valve V2. The obtained composition for forming a silicon-containing resist under layer film ML2 was subjected to metal elemental analysis to reveal that sodium: 9 ppt, calcium: 11 ppt, and iron: 13 ppt.

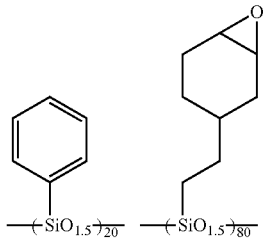

Example 1-5

From the step (1) to the step (2-2) were performed as in Example 1-1 to circulate 60 kg of PGMEA for 24 hours. The obtained PGMEA was subjected to metal elemental analysis to reveal that sodium: 8 ppt, calcium: 4 ppt, and iron: 5 ppt.

Then, 15 kg of 20% by mass PGMEA solution of the polymer shown by the following formula A, 210 g of the acid generator shown by the following formula B, and 30 g of the quencher shown by the following formula C were added into the producing apparatus and stirred for 1 hour in a similar manner as in the step (3) of Example 1-1 to prepare a composition for forming a resist upper layer film.

The stirrer 2 was stopped, and then the prepared composition for forming a resist upper layer film was circulated without passing through the metal adsorbent 5 in a similar manner as in the step (4) of Example 1-2. Thus obtained composition for forming a resist upper layer film PR1 was collected in a clean resin container by opening the collection valve V2. The obtained composition for forming a resist upper layer film PR1 was subjected to metal elemental analysis to reveal that sodium: 21 ppt, calcium: 27 ppt, and iron: 33 ppt.

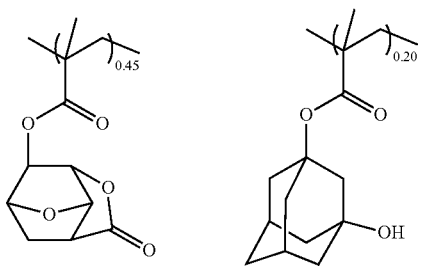

A

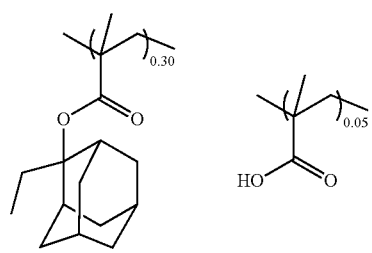

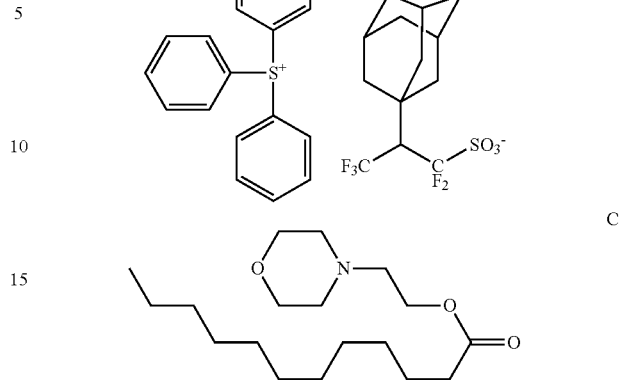

Comparative Example 1-1

The producing apparatus shown in FIG. 2 was used, and a filter cartridge with a pore size of 20 nm made from nylon as the filter 6a, and a filter cartridge with a pore size of 5 nm made from polyethylene as the filter 6b were attached to the producing apparatus as in Example 1-1. However, the metal adsorbent 5 was not attached.

Then, without performing the steps from (1) to (2-2), 28 kg of 18% by mass PGMEA solution of the condensate of bisphenolfluorene-formaldehyde used in Example 1-1, 500 g of NIKALAC MX-270 (manufactured by SANWA CHEMICAL CO., LTD), and 200 g of acid generator AG were added to 34 kg of PGMEA and stirred for 1 hour to prepare a composition for forming an organic under layer film in a similar manner as in the step (3) of Example 1-1.

The stirrer 2 was stopped, and then the tank valve V1, the circulation valve V3, and the metal adsorbent valve V4 were opened, the collection valve V2 and the metal-adsorbent bypass valve V5 were closed, followed by starting the liquid-supply pump 3 to circulate the prepared composition for forming an organic under layer film at a flow rate of 10 kg/h for 144 hours in a similar manner as in the step (4) of Example 1-2. Thus obtained composition for forming an organic under layer film UL1X was collected in a clean resin container by opening the collection valve V2. The obtained composition for forming an organic under layer film UL1X was subjected to metal elemental analysis to reveal that sodium: 151 ppt, calcium: 188 ppt, and iron: 269 ppt.

Comparative Example 1-2

In a similar manner as in Comparative Example 1-1, 22 kg of 20% by mass PGMEA solution of the condensate of dihydroxynaphthalene-formaldehyde used in Example 1-2, 450 g of NIKALAC MX-270 (manufactured by SANWA CHEMICAL CO., LTD), and 72 g of acid generator AG were added to 52 kg of PGMEA and stirred for 1 hour to prepare a composition for forming an organic under layer film, and the prepared composition was circulated. Thus obtained composition for forming an organic under layer film UL2X was collected in a clean resin container by opening the collection valve V2. The obtained composition for forming an organic under layer film UL2X was subjected to metal elemental analysis to reveal that sodium: 224 ppt, calcium: 191 ppt, and iron: 301 ppt.

Comparative Example 1-3

In a similar manner as in Comparative Example 1-1, 16 kg of 10% by mass PGEE solution of the polysiloxane compound used in Example 1-3 and 8 kg of deionized water were added to 64 kg of PGEE and stirred for 1 hour to prepare a composition for forming a silicon-containing resist under layer film, and the prepared composition was circulated. Thus obtained composition for forming a silicon-containing resist under layer film ML1X was collected in a clean resin container by opening the collection valve V2. The obtained composition for forming a silicon-containing resist under layer film ML1X was subjected to metal elemental analysis to reveal that sodium: 414 ppt, calcium: 352 ppt, and iron: 332 ppt.

Comparative Example 1-4

In a similar manner as in Comparative Example 1-1, 16 kg of 20% by mass PGMEA solution of the polysiloxane compound used in Example 1-4 and 20 g of acid generator AG were added to 60 kg of PGMEA and stirred for 1 hour to prepare a composition for forming a silicon-containing resist under layer film, and the prepared composition was circulated. Thus obtained composition for forming a silicon-containing resist under layer film ML2X was collected in a clean resin container by opening the collection valve V2. The obtained composition for forming a silicon-containing resist under layer film ML2X was subjected to metal elemental analysis to reveal that sodium: 280 ppt, calcium: 391 ppt, and iron: 311 ppt.

Comparative Example 1-5

In a similar manner as in Comparative Example 1-1, 15 kg of 20% by mass PGMEA solution of the polymer shown by the formula A, 210 g of the acid generator shown by the formula B, and 30 g of the quencher shown by the formula C were added to 60 kg of PGMEA and stirred for 1 hour to prepare a composition for forming a resist upper layer film, and the prepared composition was circulated. Thus obtained composition for forming a resist upper layer film PR1X was collected in a clean resin container by opening the collection valve V2. The obtained composition for forming a resist upper layer film PR1X was subjected to metal elemental analysis to reveal that sodium: 525 ppt, calcium: 438 ppt, and iron: 413 ppt.

As described above, the production method of the present invention enables to produce a composition for forming a coating film for a lithography with its metal impurities extremely reduced.

<Patterning Test>

Patterning were performed by using compositions for forming a coating film for a lithography prepared in Examples 1-1 to 1-5 and Comparative Examples 1-1 to 1-5. First, onto a silicon wafer on which a silicon nitride film had been formed with a film thickness of 100 nm, the composition for forming an organic under layer film was applied and then heated at 350° C. for 60 seconds to form a coating film with prescribed film thickness. Then, onto the film, the composition for forming a silicon-containing resist under layer film was applied and heated at 220° C. for 60 seconds to form a silicon-containing resist under layer film with prescribed film thickness. Subsequently, onto the film, the composition for forming a resist upper layer film was applied and baked at 110° C. for 60 seconds to form a resist upper layer film with film thickness of 100 nm. Further, onto the film, the material for a liquid-immersion top coat film (TC-1) described in Table 1 containing a polymer shown below was applied and baked at 90° C. for 60 seconds to form a top coat film with film thickness of 50 nm. Table 2 shows each combination of compositions for forming a coating film for a lithography and thicknesses of the formed film. In the following Examples 2-1 to 2-7 and Comparative Examples 2-1 to 2-4, each example using the composition for forming an organic under layer film produced by the inventive production method (i.e., the composition for forming an organic under layer film UL1 produced in the foregoing Example 1-1, and the composition for forming an organic under layer film UL2 produced in the foregoing Example 1-2) was described as an Example, and each example using the composition for forming an organic under layer film produced by a prior production method (i.e., the composition for forming an organic under layer film UL1X produced in the foregoing Comparative Example 1-1) was described as a Comparative Example.

Polymer for Top Coat Film:

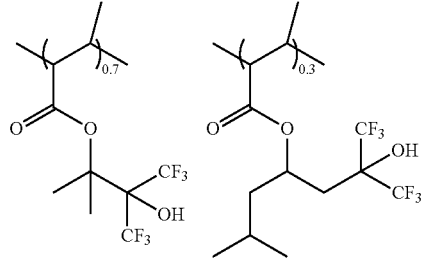

molecular weight (Mw)=8,800
dispersity (Mw/Mn) 1.69

TABLE 1

| | Polymer (parts by mass) | Solvent (parts by mass) |
|---|---|---|
| TC-1 | Polymer for top coat film (100) | diisoamyl ether (2700) 2-methyl-1-butanol (270) |

TABLE 2

| Example | Organic under layer film (film thickness) | Silicon-containing resist under layer film (film thickness) | Resist upper layer film |
|---|---|---|---|
| Example 2-1 | UL1 (200 nm) | ML1 (35 nm) | PR1 |
| Example 2-2 | UL2 (100 nm) | ML1 (35 nm) | PR1 |
| Example 2-3 | UL1 (200 nm) | ML2 (80 nm) | PR1 |
| Example 2-4 | UL2 (100 nm) | ML2 (80 nm) | PR1 |
| Example 2-5 | UL1 (200 nm) | ML1 (35 nm) | PR1X |
| Example 2-6 | UL1 (200 nm) | ML1X (35 nm) | PR1 |
| Example 2-7 | UL1 (200 nm) | ML1X (35 nm) | PR1X |
| Comparative Example 2-1 | UL1X (200 nm) | ML1 (35 nm) | PR1 |
| Comparative Example 2-2 | UL1X (200 nm) | ML1X (35 nm) | PR1 |
| Comparative Example 2-3 | UL1X (200 nm) | ML1 (35 nm) | PR1X |
| Comparative Example 2-4 | UL1X (200 nm) | ML1X (35 nm) | PR1X |

Then, these are exposed by an ArF immersion exposure apparatus (NSR-S610C, manufactured by Nikon Corporation, NA: 1.30, σ: 0.98/0.65, 35° polarized dipole illumination, 6% halftone phase shift mask), baked at 100° C. for 60 seconds (PEB), and developed by 2.38% by mass of tetramethylammonium hydroxide (TMAH) aqueous solution for 30 seconds to obtain 43 nm 1:1 positive line and space pattern.

Then, pattern collapse was observed by an electron microscope (CG4000) manufactured by Hitachi High-Technologies Corporation, and cross-sectional shape of the pattern was measured with an electron microscope (S-4700) manufactured by Hitachi, Ltd. The results are shown in Table 3.

TABLE 3

| Example | Cross-sectional shape of pattern after development | Pattern collapse |
|---|---|---|
| Example 2-1 | vertical profile | none |
| Example 2-2 | vertical profile | none |
| Example 2-3 | vertical profile | none |
| Example 2-4 | vertical profile | none |
| Example 2-5 | vertical profile | none |
| Example 2-6 | vertical profile | none |
| Example 2-7 | vertical profile | none |
| Comparative Example 2-1 | vertical profile | none |
| Comparative Example 2-2 | vertical profile | none |
| Comparative Example 2-3 | vertical profile | none |
| Comparative Example 2-4 | vertical profile | none |

As shown in Table 3, in any of Examples 2-1 to 2-7 and Comparative Examples 2-1 to 2-4, any problems were not observed on the cross-sectional shapes and pattern collapses when the resist pattern was formed in each photoresist film.

[Pattern Etching Test]

By using the resist pattern obtained in the foregoing patterning test as a mask, the pattern was transferred to the silicon-containing resist under layer film by dry etching under the following condition (1), and then transferred to the organic under layer film by dry etching under the following condition (2), and further transferred to the silicon nitride film on the silicon wafer by dry etching under the following condition (3). Then, cross-sectional shape of the obtained pattern was observed by an electron microscope (S-9380) manufactured by Hitachi, Ltd., and pattern defect was observed by a bright field defect detecting instrument KLA2800 manufactured by KLA-Tencor Corp. The results are shown in the Table 4.

(1) Etching Condition in $CHF_3/CF_4$ Gas System
Apparatus: dry etching apparatus Telius SP manufactured by Tokyo Electron Ltd.
Etching Condition (1):

| Chamber pressure | 15 Pa |
|---|---|
| Upper/Lower RF power | 500 W/300 W |
| $CHF_3$ gas flow rate | 50 mL/min |
| $CF_4$ gas flow rate | 150 mL/min |
| Treatment time | 40 seconds |

(2) Etching Condition in $CO_2/N_2$ Gas System
Apparatus: dry etching apparatus Telius SC manufactured by Tokyo Electron Ltd.
Etching Condition (2):

| Chamber pressure | 2 Pa |
|---|---|
| Upper/Lower RF power | 1,000 W/300 W |
| $CO_2$ gas flow rate | 320 mL/min |
| $N_2$ gas flow rate | 80 mL/min |
| Treatment time | 30 seconds |

(3) Etching Condition in $CHF_3/CF_4$ Gas System
Apparatus: dry etching apparatus Telius SP manufactured by Tokyo Electron Ltd.
Etching Condition (3):

| Chamber pressure | 20 Pa |
|---|---|
| Upper/Lower RF power | 500 W/300 W |
| $CHF_3$ gas flow rate | 30 mL/min |
| $CF_4$ gas flow rate | 170 mL/min |
| Treatment time | 40 seconds |

TABLE 4

| Example | Cross-sectional shape of silicon nitride film | Number of defects |
|---|---|---|
| Example 2-1 | vertical profile | 1 |
| Example 2-2 | vertical profile | 2 |
| Example 2-3 | vertical profile | 1 |
| Example 2-4 | vertical profile | 1 |
| Example 2-5 | vertical profile | 5 |
| Example 2-6 | vertical profile | 8 |
| Example 2-7 | vertical profile | 9 |
| Comparative Example 2-1 | vertical profile | 43 |
| Comparative Example 2-2 | vertical profile | 61 |
| Comparative Example 2-3 | vertical profile | 66 |
| Comparative Example 2-4 | vertical profile | 67 |

As shown in Table 4, in Examples 2-1 to 2-7, in which compositions for forming an organic under layer film for a lithography produced by the inventive methods were used, pattern defects after the etchings were extremely reduced compared to Comparative Examples 2-1 to 2-4, in which compositions for forming an organic under layer film for a lithography produced by prior methods were used. From these results, it has found that pattern defects after the pattern transfer to the substrate to be processed can be extremely reduced particularly by forming an organic under layer film, which is used as an etching mask in transferring the pattern to a substrate to be processed, with a composition for forming an organic under layer film with its metal impurities extremely reduced by the inventive production method. Moreover, pattern defects after the etchings were extremely reduced furthermore by using a combination of the composition for forming an organic under layer film, the composition for forming a silicon-containing resist under layer film, and the composition for forming a resist upper layer film which are produced by the production method of the present invention. That is, as shown in Examples 2-1 to 2-4, it has found that pattern defects after the pattern transfer to the substrate to be processed can be further reduced by forming not only an organic under layer film formed immediately above the substrate to be processed, but also a silicon-containing resist under layer film and a resist upper layer film formed thereon with a composition produced by the inventive production method.

From the foregoing, it has revealed that the method for producing a composition for forming a coating film for a lithography of the present invention enables to produce a composition for forming a coating film for a lithography with its metal impurities, which cause an etching defect, extremely reduced.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for producing a composition by using a producing apparatus provided with a metal adsorbent, a stirrer, and a filter, comprising the steps of:
   (1) introducing a solvent into the producing apparatus,
   (2) circulating the solvent in the producing apparatus so that a metal impurity is adsorbed by the metal adsorbent,
   (3) adding a raw material of the composition into the circulated solvent and homogenizing the raw material of the composition by stirring the mixture containing the raw material and the circulated solvent with the stirrer to prepare the composition, and
   (4) circulating the prepared composition in the producing apparatus so that a microscopic foreign matter is removed by the filter.

2. The method for producing a composition according to claim 1, wherein the metal adsorbent is a porous material or a membrane in which sulfo group and/or carboxyl group is/are bound to a surface of a carrier.

3. The method for producing a composition according to claim 2, wherein the carrier contains at least one material selected from the group consisting of cellulose, diatomaceous earth, polystyrene, polyethylene, and glass.

4. The method for producing a composition according to claim 1, wherein the filter comprises a filtering material containing at least one component selected from the group consisting of fluorocarbon, cellulose, nylon, polyester, and hydrocarbon.

5. The method for producing a composition according to claim 1, wherein the filter comprises a filtering material with a pore size of 20 nm or less.

6. The method for producing a composition according to claim 1, wherein the solvent is circulated until contents of each of iron, calcium, and sodium in the solvent are 50 ppt or less in the step (2).

7. The method for producing a composition according to claim 1, wherein the step (4) is performed without exchanging the filtering material provided in the filter after the step (2).

8. The method for producing a composition according to claim 1, wherein the prepared composition is circulated without passing through the metal adsorbent in the step (4).

9. The method for producing a composition according to claim 1, wherein the composition contains a repeating unit derived from an aromatic compound.

10. The method for producing a composition according to claim 9, wherein the aromatic compound comprises a phenol derivative, a naphthalene derivative, a naphthol derivative, a fluorene derivative, a phenanthrene derivative, an anthracene derivative, a pyrene derivative, a chrysene derivative, or a naphthacene derivative.

11. The method for producing a composition according to claim 1, wherein the composition contains a polysiloxane.

12. The method for producing a composition according to claim 1, wherein the composition has a silicon content of 10% by mass or more relative to the total amount of the composition.

13. The method for producing a composition according to claim 1, wherein the raw material of the composition contains a repeating unit derived from an aromatic compound.

14. The method for producing a composition according to claim 13, wherein the aromatic compound comprises a phenol derivative, a naphthalene derivative, a naphthol derivative, a fluorene derivative, a phenanthrene derivative, an anthracene derivative, a pyrene derivative, a chrysene derivative, or a naphthacene derivative.

15. The method for producing a composition according to claim 1, wherein the raw material of the composition is a polysiloxane.

16. The method for producing a composition according to claim 15, wherein the composition has a silicon content of 10% by mass or more relative to the total amount of the composition.

17. A patterning process comprising the steps of:
   producing a composition using a producing apparatus provided with a metal adsorbent, a stirrer, and a filter, the producing process comprises:
      introducing a solvent into the producing apparatus,
      circulating the solvent in the producing apparatus so that a metal impurity is adsorbed by the metal adsorbent,
      adding a raw material of the composition into the circulated solvent and homogenizing the raw material of the composition by stirring the mixture containing the raw material and the circulated solvent with the stirrer to prepare the composition, and
      circulating the prepared composition in the producing apparatus so that a microscopic foreign matter is removed by the filter to form a filtrated composition,
   forming an organic under layer film on a body to be processed,
   forming a silicon-containing resist under layer film on the organic under layer film,
   forming a resist pattern on the silicon-containing resist under layer film,
   transferring a pattern to the silicon-containing resist under layer film by dry etching using the resist pattern as an etching mask,
   transferring the pattern to the organic under layer film by dry etching using the silicon-containing resist under layer film having the transferred pattern as an etching mask, and
   transferring the pattern to the body to be processed by dry etching using the organic under layer film having the transferred pattern as an etching mask,
   wherein one or more of the organic under layer film, the silicon-containing resist under layer film, and a resist upper layer film is/are formed from the filtrated composition.

18. The patterning process according to claim 17, wherein the body to be processed is a semiconductor device substrate or the semiconductor device substrate coated with any of a metal film, a metal carbide film, a metal oxide film, a metal nitride film, a metal oxycarbide film, and a metal oxynitride film.

19. The patterning process according to claim 18, wherein the body to be processed comprises silicon, titanium, tungsten, hafnium, zirconium, chromium, germanium, copper, aluminum, indium, gallium, arsenic, palladium, iron, tantalum, iridium, molybdenum, or an alloy thereof.

* * * * *